ELECTRONIC SIGNAL SWITCHING CIRCUIT
Filed Sept. 25, 1964
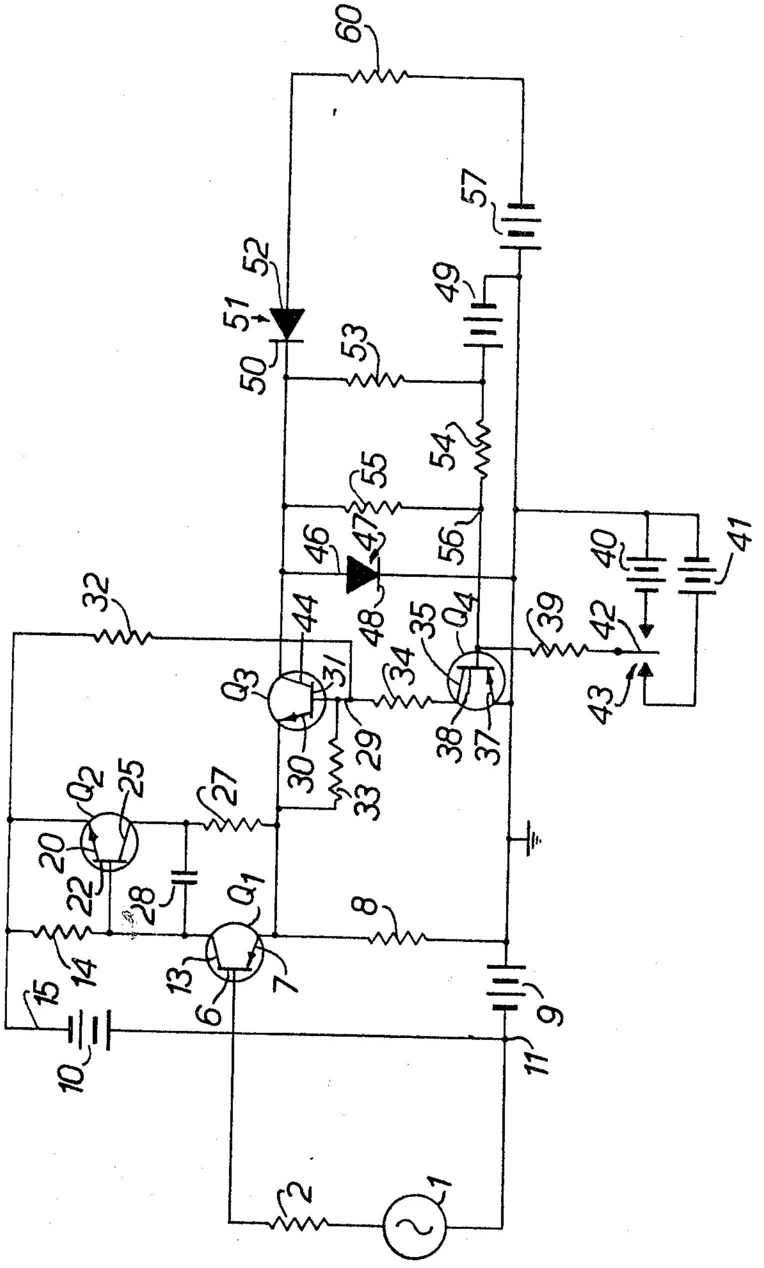
Inventor
John David Ross
By Cushman, Darby & Cushman
Attorneys 3,290,519

ELECTRONIC SIGNAL SWITCHING CIRCUIT

John D. Ross, Point Claire, Quebec, Canada, assignor to Central Dynamics Ltd., Montreal, Quebec, Canada, a corporation of Canada Filed Sept. 25, 1964, Ser. No. 399,295
9 Claims. (Cl. 307—88.5)

This invention relates to electronic signal switching circuits and has particular reference to a broad band switch.

It is one object of the invention to provide an improved switch for signals covering a frequency band which may extend from D.C. to many megacycles per second, and at the same time provide good isolation when the switch is in its off condition.

More particularly in accordance with the invention there is provided a signal switching circuit comprising an element having a high impedance condition and a low impedance condition, means for supplying a signal to be switched to said element for passage through said element, (in a preferred form the supplying means is an emitter follower circuit) a direct current potential source, (in a preferred form the source is provided by the emitter follower) means connecting said potential source to said element for transmission of direct current through said element (in a preferred form there is a switching element which forms a two stable state multivibrator with the first element) and a unidirectional conducting device connected to said element for switching of said unidirectional conducting device from low impedance to high impedance condition by transmission of direct current through said element, said signal being passed by said element and said unidirectional conducting device when said element is in its low impedance condition and being blocked by said element and said unidirectional conducting device when said element is in its high impedance condition.

A description of the invention now follows and reference will be made to the accompanying drawings which shows a schematic diagram of a switching circuit.

Having reference now to the figure, one side of a source 1 which may produce either an alternating or direct potential or both and whose effective internal resistance is represented by resistor 2, is connected to the base 6 of a PNP transistor $Q_1$. Batteries 9 and 10, series connected at junction 11, provide energizing current for the transistor $Q_1$. The side of battery 9 opposite from the junction 11 is grounded and provides base bias for the transistor $Q_1$ by virtue of connection of the other side of source 1 to junction 11. The emitter 7 of transistor $Q_1$ is connected to ground through a load resistor 8. Collector 13 of transistor $Q_1$ is connected through a resistor 14 to side 15 of battery 10. The emitter 20 of an NPN transistor $Q_2$ is also connected to side 15 and its base 22 is connected to the collector 13 of transistor $Q_1$. The collector 25 of the NPN transistor $Q_2$ is joined to the emitter 7 of transistor $Q_1$ through a resistor 27. A capacitor 28 is connected from collector 13 to collector 25. The purpose of capacitor 28 is to reduce the gain of $Q_2$ at high frequencies so that the phase shift at these frequencies in $Q_1$ and $Q_2$ and the large amount of feedback applied by the circuit between these two transistors does not cause oscillation or instability to occur. With transistors of very good high frequency performance and low phase shift the capacitor 28 and resistor 27 would not be required.

It can be seen therefore that the transistors $Q_1$ and $Q_2$ are connected in a feedback pair configuration so that the collector of $Q_2$ provides inverse feedback to the emitter 7 of $Q_1$. The pair acts as an impedance transformer and the input impedance appearing between junction 11 and base 6 is high whereas the output impedance appearing between ground and emitter 7 is low. In addition the stage will generate low distortion and provide almost unity voltage gain.

To the emitter 7 is connected the emitter 30 of an NPN transistor $Q_3$. The base 31 of $Q_3$ is connected to the junction 29 of resistor 32 and a resistor 33, which form a potential divider between side 15 of battery 10 emitter 7. The base 31 is also connected through a resistor 34 to collector 35 of a PNP switching transistor $Q_4$. The emitter 37 of $Q_4$ is grounded. Switching potentials can be applied to base 38 of transistor $Q_4$ through a series resistor 39 from a positive or negative source with respect to ground represented by a pair of batteries 40 and 41 which may be selected by the contact 42 of a single pole double throw switch 43.

The collector 44 of transistor $Q_3$ is connected to the anode 46 of a diode 47. The cathode 48 of this diode is grounded. The collector 44 is also connected to the cathode 50 of a diode 51, a battery 49 feeds the collector 44 through a resistor 53. A potential dividing network consisting of resistors 54 and 55 in series is connected across resistor 53. The base 38 of transistor $Q_4$ is connected to the junction 56 of resistors 55 and 54. The load represented by resistor 60 is connected between the anode 52 of diode 51, and one side of a battery 57. The other side of battery 57 is grounded. The battery 57 provides the necessary bias for proper operation of diode 51.

The operation of the circuit will now be described. An input signal from source 1 is applied between junction 11 and the base 6 of transistor $Q_1$. The signal appears reversed in phase across resistor 14 and is applied to base 22 of transistor $Q_2$. Resistor 8 forms the emitter load of transistor $Q_1$ and the collector load of resistor $Q_2$. In view of the inverse feedback developed both by transistor $Q_2$ and in the load resistor 8, the output impedance across resistor 8 is very low both for D.C. and A.C. The D.C. potential of emitter 7 is stable at about 0.2 volt (for the 2N990 shown in Table 1) less negative than the potential of the base 6 (established by junction 11). The potential difference between emitter 7 and base 6 will however depend upon the transistor used for $Q_1$.

Transistors $Q_3$ and $Q_4$ form a bi-stable multivibrator. In one condition $Q_3$ and $Q_4$ are both switched on and in the other they are both switched off. They are brought to the on condition by the application of a negative potential to contact 42. Current is then drawn through resistor 34 by the forward biasing of the emitter/base junction of transistor $Q_4$ which applies forward bias to the emitter/base junction of transistor $Q_3$. The potential dividing network of resistors 32 and 33 holds the transistor $Q_3$ cut off in the absence of current drawn by collector 35. The direct current flowing through transistor $Q_3$ between the stabilized D.C. potential level of emitter 7 and the positive terminal of 49 lowers the potential on collector 44 which holds down the potential at point 56 and maintains the forward bias on the emitter base junction of transistor $Q_4$, after the trigger potential is removed from contact 42. The lowering of the potential on collector 44 (below that of ground) reverse biases the diode 47 and changes it from the previously conducting to the non-conducting state. At the same time this negative potential on collector 44 causes conduction to occur through diode 51 provided this potential is more negative than that established on the anode of diode 51 by battery 57. Current flow through battery 57 will be in the reverse direction for that battery. It is now seen that a conducting path has been established from emitter 7 to load 60, through transistor $Q_3$ and diode 51. The voltage on battery 57 is chosen to give good conduction through diode 51 with consequent low series impedance to the signal by the diode.

In order to switch off the multivibrator circuit a positive potential is applied to contact 42 such as by moving it into connection with the positive terminal of battery 41. The reverse base/emitter bias applied to base 38 cuts off transistor $Q_4$, interrupts current through resistor 34, and causes the potential on base 31 to rise negatively as determined by the potential dividing action through resistors 32 and 33. This shuts off transistor $Q_3$ and allows the potential on collector 44 to rise positively as determined by battery 49. The rising of potential holds the reverse bias on base 38 after the trigger potential from battery 41 is removed, switches on diode 47 and switches off diode 51. The connection between emitter 7 and load 60 is now broken, both by the absence of conduction through the transistor $Q_3$ and through the diode 51, and by the shorting down of the collector 44 to ground by diode 47. The effect of the two diodes is to reduce capacitative through-pass effects in transistor $Q_3$. The diode 51 provides additional current isolation for the load 60.

During the on condition the signal is appearing across resistor 8 at very low impedance and the forward conducting impedances of saturated transistor $Q_3$ and diode 51 are low. Shunt capacitances to ground are thus of reduced effect. The signals therefore applied by source 1 are reproduced at load 60 over a wide bandwidth. The triggering signals applied to contact 42 need not be by means of batteries as shown but may be generated as pulses of opposite polarity from any suitable source which need not be of low impedance or able to handle much power. It is seen too that the transistor $Q_3$ acts not only as a signal switch but also as part of the multivibrator circuit which generates the switching action.

In certain instances the low impedance output circuit comprising transistors $Q_1$ and $Q_2$ may be replaced by a suitable transformer, the secondary of which is fed from a constant potential source to provide the reference voltage for the emitter of transistor $Q_3$. One advantage of using the emitter follower circuit is that very broad bandwidth operation is possible, and with the sample values of the components given in Table 1, a frequency range of D.C. to about 40 mc./s. has been obtained.

*Table 1*

| Description: | Typical values or type |
|---|---|
| Resistor **14** | [1] 270 ohms. |
| Resistor **27** | [1] 680 ohms. |
| Resistor **32** | [1] 22K ohms. |
| Resistor **8** | [1] 10K ohms. |
| Resistor **33** | [1] 12K ohms. |
| Resistor **34** | [1] 6.8K ohms. |
| Resistor **55** | [1] 15K ohms. |
| Resistor **53** | [1] 18K ohms. |
| Resistor **39** | [1] 18K ohms. |
| Resistor **54** | [1] 47K ohms. |
| Resistor **60** (load) | [1] 4.7K ohms. |
| PNP transistor $Q_1$ | 2N990. |
| NPN transistor $Q_2$ | 2N2714. |
| NPN transistor $Q_3$ | 2N2714. |
| PNP transistor $Q_4$ | AS221. |
| D.C. voltage source **10** | 10 volts D.C. |
| D.C. voltage source **9** | 10 volts D.C. |
| D.C. voltage source **40** | 6 volts D.C. |
| D.C. voltage source **41** | 6 volts D.C. |
| D.C. voltage source **49** | 12 volts D.C. |
| D.C. voltage source **57** | 6 volts D.C. |
| Capacitor **28** | 5 picofarads. |
| Semi-conductor diode **47** | 1N191. |
| Semi-conductor diode high conductance, low capacitance type **51** | AAZ12. |

[1] One-quarter watt 5%.

I claim:

1. A signal switching circuit for switching signals having a wide frequency band from an input load to an output load, said switching circuit comprising:

means for generating a control signal;

first gate means having an input element, output element, and control element, said input element being connected to said input load, said first gate means opening in response to said control signal being applied to said control element of said first gate means, second gate means connected between said output element of said first gate means and to said output load, said second gate means opening in response to said control signal;

third gate means having at least two terminals, one terminal of which is connected to said output element and another terminal of which is connected to a source of reference potenetial, said third gate means closing in response to said control signal, said second and third gate means thereby isolating said output load from said first gate means when the latter is closed, and said first and second gate means having impedances low enough that shunt capacitances across said load are of reduced effect.

2. A signal switching circuit, as in claim 1, where said reference potential has a constant value.

3. A signal switching circuit, as in claim 1, including impedance transformer means connected between said input load and said first gate means when said wide band signals are applied to said input load.

4. A signal switching circuit, as in claim 3, said transformer means including a first transistor having a collector, emitter, and a base, the base of which is connected to one end of said input load;

a second transistor of opposite conductivity type to said first transistor having a base connected to the collector of said first transistor and emitter and collector, the collector of which is connected to the emitter of said first transistor and to the input element of said first gate means; and means for biasing the emitter of said second transistor.

5. A signal switching circuit, as in claim 1, where said first gate means includes a junction transistor having a base corresponding to the said control element, an emitter corresponding to the said input element, and a collector corresponding to the said output element and having its emitter connected to the input load, its base connected to the means for generating a control signal and its collector connected to the second gating means.

6. A signal switching circuit, as in claim 5, where said third gating means includes a diode having an anode corresponding to said one terminal and having its anode connected to the collector of said first gate means and having a cathode corresponding to said another terminal and having its cathode connected to the said source of reference potential.

7. A signal switching circuit, as in claim 6, where said gating means includes a diode with its cathode connected to the collector of the first gate means and its anode connected to said output load.

8. A signal switching circuit, as in claim 1, where said means for generating a control signal includes a switching means for developing said control signal, said switching means having a control element, and means for applying switching signals to said last-mentioned control element thereby applying said control signal to said first gate means.

9. A signal switching circuit, as in claim 8, where said switching signals are pulses, said circuit including means for keeping said first gate means open after said switching pulses are applied, said last-mentioned means being responsive to said first gate means being opened by said control signal.

(References on following page)

References Cited by the Examiner

UNITED STATES PATENTS

| | | | |
|---|---|---|---|
| 2,665,845 | 1/1954 | Trent | 307—88.5 |
| 2,670,445 | 2/1954 | Felker | 307—88.5 |
| 2,858,456 | 10/1958 | Royer et al. | 307—88.5 |
| 3,078,395 | 2/1963 | Fraipont | 307—88.5 |
| 3,153,729 | 10/1964 | Leakey | 307—88.5 |
| 3,171,977 | 3/1965 | Sharp | 328—99 X |
| 3,184,609 | 5/1965 | Yee | 307—88.5 |

ARTHUR GAUSS, *Primary Examiner.*

J. ZAZWORSKY, *Assistant Examiner.*